United States Patent
Li

(10) Patent No.: US 6,992,388 B2
(45) Date of Patent: Jan. 31, 2006

(54) FORMATION OF MICRO ROUGH POLYSURFACE FOR LOW SHEET RESISTANT SALICIDED SUB-QUARTER MICRON POLYLINES

(75) Inventor: Ming Michael Li, Cave Creek, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 516 days.

(21) Appl. No.: 10/068,534

(22) Filed: Feb. 6, 2002

(65) Prior Publication Data

US 2002/0070452 A1 Jun. 13, 2002

Related U.S. Application Data

(62) Division of application No. 09/126,960, filed on Jul. 31, 1998, now Pat. No. 6,383,905.

(51) Int. Cl.
*H01L 23/48* (2006.01)
*H01L 23/52* (2006.01)
*H01L 29/40* (2006.01)

(52) U.S. Cl. ............... 257/739; 257/347; 257/619; 257/754; 257/750

(58) Field of Classification Search ........ 257/412–413, 257/377–384, 754–756, 770
See application file for complete search history.

(56) References Cited

U.S. PATENT DOCUMENTS

| | | | |
|---|---|---|---|
| 5,182,232 A | 1/1993 | Chhabra et al. | 437/200 |
| 5,394,012 A | 2/1995 | Kimura | 257/739 |
| 5,418,188 A | 5/1995 | Harper et al. | 437/200 |
| 5,422,289 A * | 6/1995 | Pierce | 438/297 |
| 5,554,566 A * | 9/1996 | Lur et al. | 438/655 |
| 5,563,096 A * | 10/1996 | Nasr | 438/297 |
| 5,585,295 A | 12/1996 | Wu | 437/44 |
| 5,599,746 A | 2/1997 | Lur et al. | 437/200 |
| 5,648,673 A * | 7/1997 | Yasuda | 257/382 |
| 5,654,589 A * | 8/1997 | Huang et al. | 257/763 |
| 5,767,013 A | 6/1998 | Park et al. | 438/622 |
| 5,780,929 A * | 7/1998 | Zeininger et al. | 257/751 |
| 5,877,063 A | 3/1999 | Gilchrist | 438/398 |
| 5,893,751 A * | 4/1999 | Jenq et al. | 438/655 |
| 5,904,529 A * | 5/1999 | Gardner et al. | 438/286 |
| 5,937,325 A * | 8/1999 | Ishida | 438/655 |
| 5,993,685 A | 11/1999 | Currie et al. | 252/79.1 |
| 6,074,926 A | 6/2000 | Cathey et al. | 438/398 |
| 6,232,173 B1 * | 5/2001 | Hsu et al. | 438/253 |

(Continued)

FOREIGN PATENT DOCUMENTS

JP 06151353 A * 5/1994

OTHER PUBLICATIONS

Chang, C. Y. and Sze, S.M., "ULSi Technology," 1996, The McGraw-Hill Companies, Inc., pp. 229, 395-397.

(Continued)

*Primary Examiner*—B. William Baumeister
*Assistant Examiner*—Igwe U. Anya
(74) *Attorney, Agent, or Firm*—David V. Carlson; Lisa K. Jorgenson

(57) ABSTRACT

This invention relates to a method for manufacturing a semiconductor device having polysilicon lines with micro-roughness on the surface. The micro-rough surface of the polysilicon lines help produce smaller grain size silicide film during the formation phase to reduce the sheet resistance. The micro-rough surface of the polysilicon lines also increases the effective surface area of the silicide contacting polysilicon lines thereby reduces the overall resistance of the final gate structure after metallization.

15 Claims, 2 Drawing Sheets

U.S. PATENT DOCUMENTS

| | | | |
|---|---|---|---|
| 6,242,333 B1 * | 6/2001 | McNeil et al. | 438/592 |
| 6,297,525 B1 * | 10/2001 | Parekh et al. | 257/306 |
| 6,359,321 B2 * | 3/2002 | Shimizu et al. | 257/412 |
| 6,424,011 B1 * | 7/2002 | Assaderaghi et al. | 257/350 |
| 6,555,432 B2 * | 4/2003 | Sandhu et al. | 438/253 |
| 2001/0021552 A1 * | 9/2001 | Parekh et al. | 438/239 |
| 2002/0008291 A1 * | 1/2002 | Shimizu et al. | 257/412 |

OTHER PUBLICATIONS

Wolf, S., "Silicon Processing for the VLSI Era," vol. 2—Process Integration, 1990, Lattice Press, pp. 45, 354-357.

* cited by examiner

FORMATION OF MICRO ROUGH POLYSURFACE FOR LOW SHEET RESISTANT SALICIDED SUB-QUARTER MICRON POLYLINES

CROSS-REFERENCE TO RELATED APPLICATION

This application is a Divisional of U.S application Ser. No. 09/126,960, now U.S. Pat. No. 6,383,905 B2, filed Jul. 31, 1998.

TECHNICAL FIELD

This invention relates to a method for forming silicide on a polysilicon line of a semiconductor device. More particularly, this invention relates to a method for forming silicide over a controllable micro-rough surface of a polysilicon line, and a device made by the same.

BACKGROUND OF THE INVENTION

Polysilicon has become the prevalent gate material of MOS devices for over a decade. In addition to MOS gates, uses of polysilicon in MOS or other semiconductor devices have also increased prominently. However, although polysilicon provides many advantages, such as self-alignment, over metal as the gate material, its resistance level is still too high to provide interconnections among semiconductor devices. Therefore, after the formation and patterning of a polysilicon layer to form polysilicon lines, a device will typically go through, inter alia, a silicide process for forming a lower resistance silicide layer. As the size of semiconductor devices becomes smaller and smaller, how to provide good quality interconnections for devices having sub-quarter $\mu$m width of polysilicon lines becomes one of the major challenge to the current semiconductor industry.

Although polysilicon has a low contact resistance with silicon, it still exhibits too high a resistance to the interconnection metal materials. Creating a multi-metal stack of the polysilicon (called polycide) having a silicide, e.g., the titanium silicide ($TiSi_2$), film is one solution. The silicide film makes a low contact resistance with polysilicon and reduces the overall sheet resistance of the polycide structure. While other silicide materials have been used for reducing contact resistance with polysilicon, a titanium silicide film is the most popular one used in the semiconductor industry.

Growing the titanium silicide film on the polysilicon lines and on active regions of the substrate typically includes two phases. In a first phase, generally called the C49 phase formation, the titanium is first deposited on the surface of the device. The deposition of titanium (Ti) is then followed by a first rapid thermal anneal (RTA) step to cause the titanium reacted with the underlying silicon substrate or polysilicon lines and thus form the titanium silicide film. Once the titanium silicide film has been formed, those unreacted portions of the titanium are then removed, forming self-aligned silicide (Salicide) on polysilicon and active regions only.

In a second phase, the previously formed titanium silicide film will go through another anneal step, such as a second RTA step, to further reduce the overall sheet resistance of the newly formed titanium silicide. This second phase of transformation is commonly referred to a C54 phase. A simplified structure of a device produced after the C54 phase is illustrated in FIG. 1. The current silicide technology, however, faces two major difficulties for future sub-quarter $\mu$m technology of silicide over polysilicon lines. First, as the width of the polysilicon lines is reduced to being in the sub-quarter $\mu$m range, it is more difficult to grow a smaller grain size titanium silicide during the C49 phase. Second, for smaller width of the polysilicon lines higher annealing temperature is required for the C54 phase transformation without resulting in $TiSi_2$ agglomeration.

Furthermore, when the width of the polysilicon lines are reduced to about 0.1 $\mu$m the formation of titanium silicide having the grain size larger than 0.1 $\mu$m during the C49 phase will suppress the grain growth of the titanium silicide during the later C54 phase. As a result, the titanium silicide will have an undesirable higher sheet resistance. To cure this problem, a much higher RTA temperature for the titanium silicide is required. The much higher RTA temperature is very undesirable because it will not only increase difficulties in manufacture, e.g., higher costs or equipment problems, but also may cause device failure due to the thermal budget limitation of the device during manufacturing, and the introduced defects such as the $TiSi_2$ agglomeration.

SUMMARY OF THE INVENTION

An object of the invention is to provide a method for manufacturing a semiconductor device having low sheet resistance silicide over polysilicon lines of sub-quarter $\mu$m or even less than 0.1 $\mu$m width. In one embodiment of the invention, small indentations or scratches are formed on the surface of the polysilicon lines before the formation of the silicide.

The features and advantages of the present invention will be made apparent, by way of illustration and not by limitation, in the following description of embodiments illustrated in the annexed drawings. The figures show enlarged portions of certain areas to better illustrate the inventive feature and none of the figures are understood as being in scale or exact proportion.

DETAILED DESCRIPTION OF THE INVENTION

Figure 1:
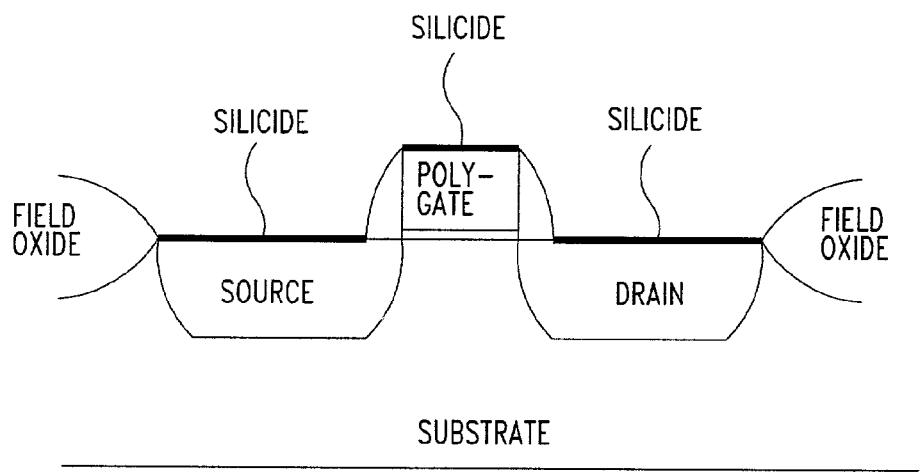
FIG. 1 shows the simplified structure of a known device formed by a conventional silicide process.
Figure 2:
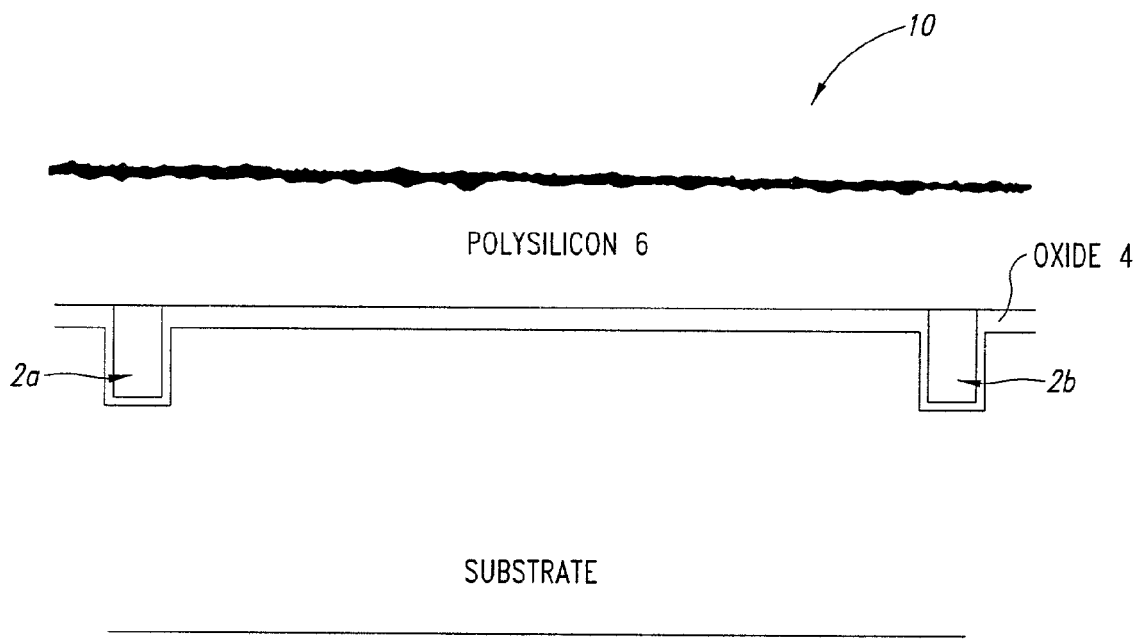
FIG. 2 shows the structure of a device having micro-roughness on the surface of a polysilicon layer according to the present invention.

Referring to FIG. 2, an electrical isolation step is first performed on a semiconductor wafer 1 to isolate a device 10 from other devices of an integrated circuit. The isolation step may be accomplished by any suitable technology, such as the shallow trench isolation (STI), etch and back fill trench, or the LOCOS technology, trench being preferred over LOCOS. Isolation regions 2a and 2b are thus formed as shown in FIG. 2. After that, a gate oxide film 4 and then a polysilicon layer 6 are subsequently formed on the substrate. The polysilicon layer may be deposited by any suitable conventional technology, such as CVD or LPCVD. Typically, the polysilicon layer has a thickness of about 2000 Å–3000 Å, i.e., about 0.2 $\mu$m–0.3 $\mu$m.

After the polysilicon layer 6 is formed, a step for forming a micro-rough top surface of the polysilicon layer is carried out. The formation of a micro-rough top surface of the polysilicon layer 6 is accomplished by creating intentional scratches produced by chemical mechanical polishing (CMP). A CMP step is carried out of a selected size with microparticles in the slurry which will leave small indentations or scratches in the polysilicon. A slurry solution having particles with very small size, preferably smaller than 0.1 µm in dimension, is used to create this micro-roughness on the surface of the polysilicon layer 6. Trench isolation is preferred (though not required) because the top of the polysilicon will be more planar prior to the CMP step. Thereafter, a cleaning step is followed to clean wafers to a required defect control level.

Figure 3:
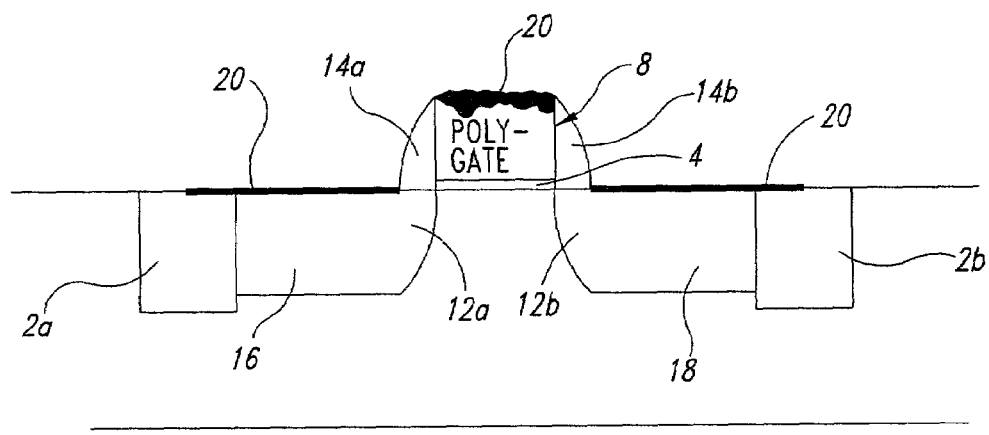
FIG. 3 shows the final structure after a salicide step according to the present invention.

The size of the particles is selected to be somewhat less than polysilicon gate width. For a minimum dimension technology of 0.15 µm for a polysilicon line width, the particles would have a maximum dimension of 0.1 µm, or in one embodiment, 0.075 µm or less. In one embodiment, the particle size in the slurry is selected to be less than one-half the polysilicon line width in which the micro-rough surface is to be formed. The polysilicon layer 6 and the thin oxide film 4 then go through a mask and etch step to form a polysilicon gate 8 for the device 10, as shown in FIG. 3. Thereafter, conventional steps for defining active regions are followed. Referring to FIG. 3, these steps may include lightly doped areas (12a and 12b) implantation, spacers (14a and 14b) formation, and source (16)/drain (18) regions definition.

After the actives regions 16 and 18 are formed, the C49 phase of silicidization follows. First, a refractory metal film, e.g., a titanium or titanium/titanium nitride (Ti/TiN) stack film, is deposited on the wafer 1. The deposition may be accomplished by any suitable method, such as CVD, LPCVD, sputtering, electrolytic plating, or electroless plating, etc. The device 10 then goes through a RTA process to cause the refractory metal film react with the underlying polysilicon gate 8 and the wafer 1, where the active regions 16 and 18 are located, in order to form a silicide film 20. Those unreacted portions, i.e., those portions of the refractory metal not in contact with the polysilicon gate 8 or the source and drain regions 16 and 18, of the refractory metal are then removed. Thereafter, the C54 transformation phase of the silicide film 20 may follow in the same or later anneal steps. According to the present invention, it is possible that the C54 phase of transformation may not be necessary and thus further annealing is not carried out while still obtaining a desired low resistance of the silicide film. Alternatively, a lower annealing temperature may be carried out during the C54 phase. The final structure of the device according to the present invention is illustrated in FIG. 3.

Figure 4:
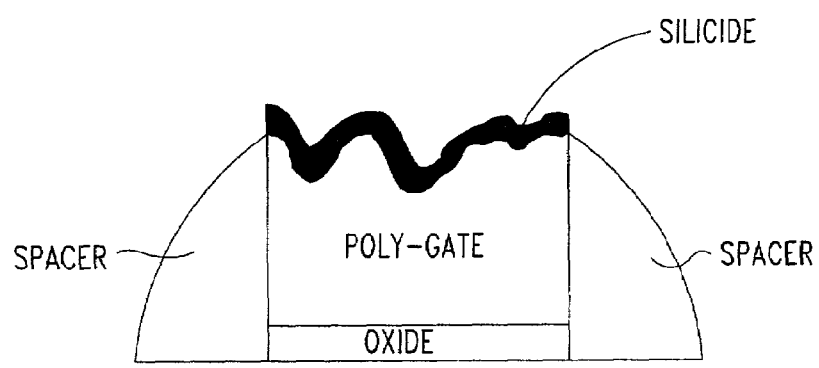
FIG. 4 shows the enlarge portion of the silicide over the polysilicon gate according to the present invention.

FIG. 4 shows an enlarged portion of the polysilicon gate according to the present invention. The micro-rough surface of the polysilicon gate according to the present invention provides an enlarged effective surface area of the silicide film, as compared to those without a micro-rough surface. Such an enlarged effective surface area of the silicide will lower the sheet resistance of the polycide gate 8 of the device 10. Furthermore, the formation of the micro-rough surface of the polysilicon gate 8 will cause smaller polysilicon grain size due to amorphozation of small particles on the polysilicon surface and therefore will prevent $TiSi_2$ lateral growth during the C49 phase. Therefore, the $TiSi_2$ agglomeration problem during the C54 phase will then be eased. As a result, the present invention has advantages of providing a low sheet resistance polycide gate structure, which could be as narrow as less than 0.1 µm, of a semiconductor device. In addition, the present invention permits lower RTA temperature for both the C49 and C54 phases, as compared to the conventional method which requires undesirable higher RTA temperature when the dimension of the polysilicon lines are reduced to sub-quarter µm range. It may be possible to avoid the anneal steps needed to reach the C54 phase in one embodiment or, on the other hand, reach this phase at a lower temperature or with the same anneal step as the formation of the C49 phase.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An integrated semiconductor device, comprising:
   a semiconductor material substrate;
   a polysilicon line forming a gate region, said polysilicon line having a width no greater than 0.1 µm and micro-rough indentations on a top surface portion of the polysilicon line formed by chemical mechanical polishing using a slurry solution having particles of a maximum size of less than one-half of a width of the polysilicon line; and
   a silicide film covering said micro-rough top surface portion of the polysilicon line, the silicide film remaining in a C-49 phase and not later anodized to a C-54 phase.

2. The integrated device of claim 1, further comprising:
   a plurality of isolation areas;
   a thin oxide film between said polysilicon line and the substrate; and
   a plurality of patterned active regions positioned on the substrate and on opposite sides of said polysilicon line.

3. The integrated device of claim 2 wherein said polysilicon line forms a polysilicon gate region of the device and said active regions are source and drain regions of the device.

4. The integrated device of claim 3, further comprising spacers adjacent to the polysilicon gate region and lightly doped regions under said spacers and adjacent to said source and drain regions.

5. The integrated device of claim 1 wherein said silicide film comprises titanium silicide or titanium silicide/titanium nitride stack film.

6. The integrated device of claim 1 wherein said silicide film covering said micro-rough top surface of the polysilicon line has an increased effective surface area.

7. The integrated device of claim 1, further comprising a metallization structure positioned on the silicide film for providing interconnection.

8. The integrated device of claim 7 wherein said metallization structure comprises a multi-stack metal layer.

9. An integrated circuit, comprising:
   a polysilicon line having a width no greater than 0.1 µm, the polysilicon line forming a gate region and formed to have micro-rough indentations on a top surface by chemical mechanical polishing using a slurry solution having particles of a maximum size of less than one-half of a width of the polysilicon line; and
   a silicide formed on the micro-rough top surface of the polysilicon line, the silicide remaining in a C-49 phase and not later anodized to enter a C-54 transformation phase.

10. The integrated circuit of claim 9, further comprising a metallization structure positioned on the silicide for providing interconnection.

11. A semiconductor device, comprising:
a polysilicon line forming a gate region on a semiconductor material substrate, the polysilicon line having a width no greater than 0.1 μm and a top surface treated by chemical mechanical polishing using a slurry solution having particles of a maximum size of less than one-half the width of the polysilicon line to form micro-rough indentations in the top surface; and
a silicide film formed on the micro-rough top surface of the polysilicon line, the silicide film remaining in a C-49 phase.

12. The device of claim 11 wherein the silicide film is not later anodized to enter a C-54 transformation phase.

13. The device of claim 12, further comprising a metallization structure positioned on the silicide film for providing interconnection.

14. The device of claim 13 wherein the metallization structure comprises a multi-stack metal layer.

15. The device of claim 12 wherein the silicide film comprises titanium silicide or titanium silicide/titanium nitride stack film.

* * * * *